(12) United States Patent
Ramesh et al.

(10) Patent No.: US 11,609,852 B2
(45) Date of Patent: *Mar. 21, 2023

(54) HIERARCHICAL MEMORY APPARATUS

(71) Applicant: Micron Technology, Inc., Boise, ID (US)

(72) Inventors: Vijay S. Ramesh, Boise, ID (US); Anton Korzh, Santa Clara, CA (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/307,765

(22) Filed: May 4, 2021

(65) Prior Publication Data
US 2021/0255954 A1    Aug. 19, 2021

Related U.S. Application Data

(63) Continuation of application No. 16/547,654, filed on Aug. 22, 2019, now Pat. No. 11,036,633.

(51) Int. Cl.
*G06F 12/08*    (2016.01)
*G06F 13/20*    (2006.01)
(Continued)

(52) U.S. Cl.
CPC .......... *G06F 12/08* (2013.01); *G06F 13/1668* (2013.01); *G06F 13/20* (2013.01); *G11C 11/409* (2013.01)

(58) Field of Classification Search
CPC ...... G06F 12/08; G06F 13/1668; G06F 13/20; G11C 11/409
(Continued)

(56) References Cited

U.S. PATENT DOCUMENTS 6,732,311 B1 ‡   5/2004   Fischer .................... G06F 11/27
                                                               712/227
7,555,629 B2 ‡   6/2009   Kim ....................... G06F 13/385
                                                               365/185.11
(Continued)

FOREIGN PATENT DOCUMENTS

WO          2009073542 A1      6/2009
WO      WO-2009073542 A1 ‡    6/2009   ............. G06F 9/461

OTHER PUBLICATIONS

International Search Report and Written Opinion from related PCT Application No. PCT/UX2020/046142, dated Nov. 20, 2020, 12 pages.‡

(Continued)

*Primary Examiner* — Hua J Song
(74) *Attorney, Agent, or Firm* — Brooks, Cameron & Huebsch, PLLC

(57) ABSTRACT

Systems, apparatuses, and methods related to hierarchical memory are described. A hierarchical memory system that can leverage persistent memory to store data that is generally stored in a non-persistent memory. Logic circuitry can be configured to determine that a request to access a persistent memory device corresponds to an operation to divert data from the non-persistent memory device to the persistent memory device, generate an interrupt signal, and cause the interrupt signal to be asserted on a host coupleable to the logic circuitry as part of the operation to divert data from the non-persistent memory device to the persistent memory device. Access data and control messages can be transferred between or within a memory device, including to or from a multiplexer and/or a state machine. A state machine can include logic circuitry configured to transfer interrupt request messages to and receive interrupt request messages.

19 Claims, 6 Drawing Sheets

(51) Int. Cl.
*G06F 13/16* (2006.01)
*G11C 11/409* (2006.01)

(58) Field of Classification Search
USPC .......................................................... 711/117
See application file for complete search history.

(56) References Cited

U.S. PATENT DOCUMENTS

| | | | | | |
|---|---|---|---|---|---|
| 8,286,162 | B2 ‡ | 10/2012 | Neiger | ................... | G06F 9/4812 718/1 |
| 9,032,181 | B2 ‡ | 5/2015 | Ahmad | ................. | G06F 9/5077 711/203 |
| 2004/0128409 | A1 * | 7/2004 | Bennett | .................. | G06F 3/061 710/22 |
| 2007/0288692 | A1 ‡ | 12/2007 | Bruce | ..................... | G06F 3/061 711/113 |
| 2007/0300038 | A1 ‡ | 12/2007 | Ware | .................. | G06F 12/0292 711/203 |
| 2008/0229000 | A1 ‡ | 9/2008 | Kim | ....................... | G11C 16/10 711/103 |
| 2009/0271583 | A1 ‡ | 10/2009 | Kershaw | ............. | G06F 12/1491 711/163 |
| 2011/0167422 | A1 ‡ | 7/2011 | Eom | .................... | G06F 9/45558 718/1 |
| 2013/0132639 | A1 ‡ | 5/2013 | Ami | ..................... | G06F 12/0804 711/103 |
| 2013/0174148 | A1 ‡ | 7/2013 | Amit | ....................... | G06F 9/327 718/1 |
| 2017/0220592 | A1 ‡ | 8/2017 | Foltz | .................. | G06F 12/0804 |

OTHER PUBLICATIONS

Notice of Reasons for Rejection from related Korean Patent Application No. 10-2022-7009294, dated Jul. 20, 2022, 7 pages.

\* cited by examiner
‡ imported from a related application

HIERARCHICAL MEMORY APPARATUS

PRIORITY INFORMATION

This application is a Continuation of U.S. application Ser. No. 16/547,654, filed on Aug. 22, 2019, the contents of which are incorporated herein by reference.

TECHNICAL FIELD

The present disclosure relates generally to semiconductor memory and methods, and more particularly, to a hierarchical memory apparatus.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), and synchronous dynamic random access memory (SDRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
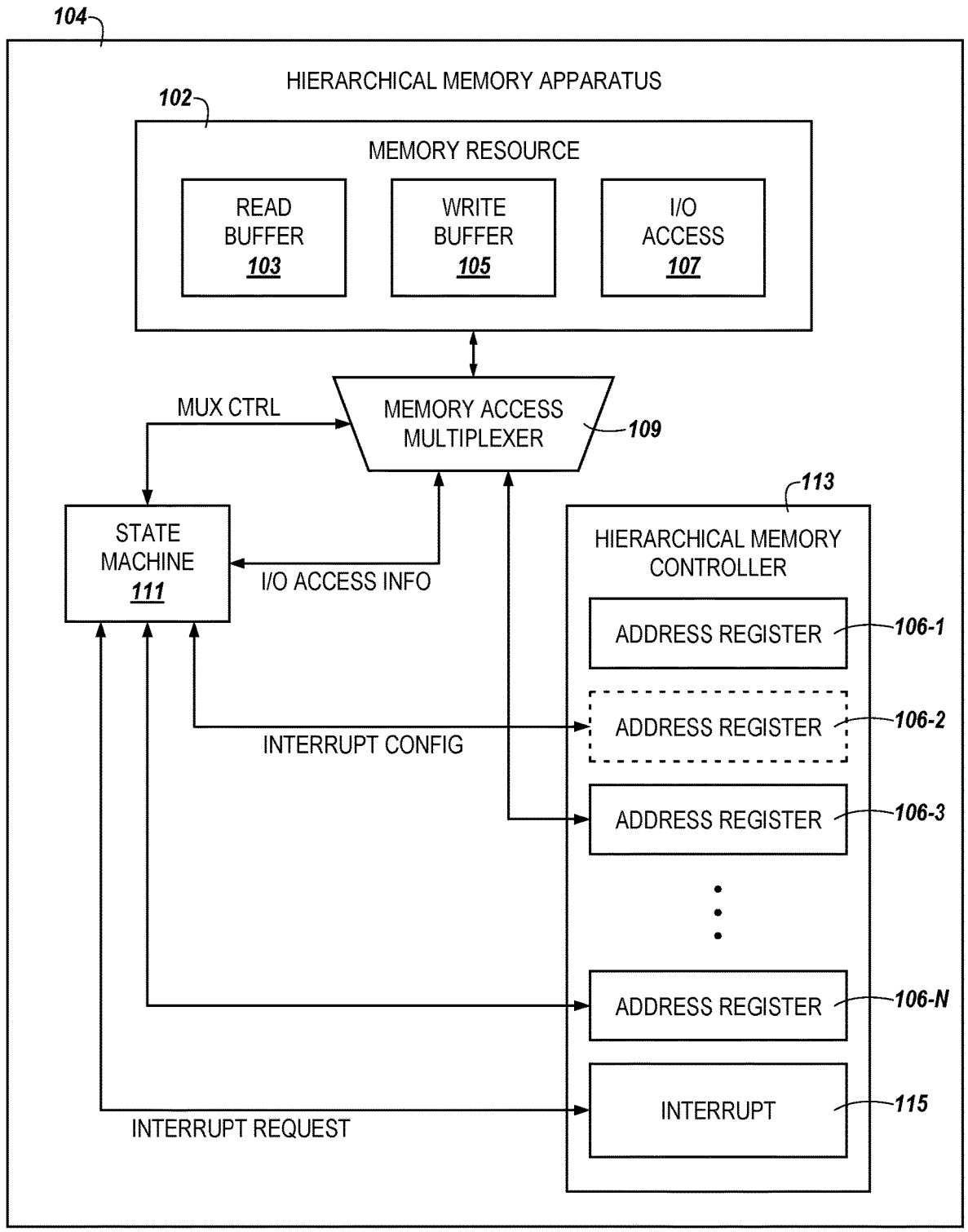
FIG. 1 is a functional block diagram of a hierarchical memory apparatus in accordance with a number of embodiments of the present disclosure.

A hierarchical memory apparatus is described herein. An example apparatus can include a state machine in communication with the hierarchical memory apparatus and configured to transfer access data and control messages to a multiplexer and/or receive access data from the multiplexer. In addition, the state machine can include logic circuitry configured to transfer interrupt request messages to and receive the interrupt request messages from the hierarchical memory controller. The hierarchical memory apparatus can be part of a hierarchical memory system that can leverage persistent memory to store data that is generally stored in a non-persistent memory. The logic circuitry can be configured to determine that a request to access a persistent memory device corresponds to an operation to divert data from the non-persistent memory device to the persistent memory device, generate an interrupt signal, and cause the interrupt signal to be asserted on a host coupleable to the logic circuitry as part of the operation to divert data from the non-persistent memory device to the persistent memory device.

Computing systems utilize various types of memory resources during operation. For example, a computing system may utilize a combination of volatile (e.g., random-access memory) memory resources and non-volatile (e.g., storage) memory resources during operation. In general, volatile memory resources can operate at much faster speeds than non-volatile memory resources and can have longer lifespans than non-volatile memory resources; however, volatile memory resources are typically more expensive than non-volatile memory resources. As used herein, a volatile memory resource may be referred to in the alternative as a "non-persistent memory device" while a non-volatile memory resource may be referred to in the alternative as a "persistent memory device."

However, a persistent memory device can more broadly refer to the ability to access data in a persistent manner. As an example, in the persistent memory context, the memory device can store a plurality of logical to physical mapping or translation data and/or lookup tables in a memory array in order to track the location of data in the memory device, separate from whether the memory is non-volatile. Further, a persistent memory device can refer to both the non-volatility of the memory in addition to using that non-volatility by including the ability to service commands for successive processes (e.g., by using logical to physical mapping, look-up tables, etc.).

These characteristics can necessitate trade-offs in computing systems in order to provision a computing system with adequate resources to function in accordance with ever-increasing demands of consumers and computing resource providers. For example, in a multi-user computing network (e.g., a cloud-based computing system deployment, a software defined data center, etc.), a relatively large quantity of volatile memory may be provided to provision virtual machines running in the multi-user network. However, by relying on volatile memory to provide the memory resources to the multi-user network, as is common in some approaches, costs associated with provisioning the network with memory resources may increase, especially as users of the network demand larger and larger pools of computing resources to be made available.

Further, in approaches that rely on volatile memory to provide the memory resources to provision virtual machines in a multi-user network, once the volatile memory resources are exhausted (e.g., once the volatile memory resources are allocated to users of the multi-user network), additional users may not be added to the multi-user network until additional volatile memory resources are available or added. This can lead to potential users being turned away, which can result in a loss of revenue that could be generated if additional memory resources were available to the multi-user network.

Volatile memory resources, such as dynamic random-access memory (DRAM) tend to operate in a deterministic manner while non-volatile memory resources, such as storage class memories (e.g., NAND flash memory devices, solid-state drives, resistance variable memory devices, etc.) tend to operate in a non-deterministic manner. For example, due to error correction operations, encryption operations, RAID operations, etc. that are performed on data retrieved from storage class memory devices, an amount of time between requesting data from a storage class memory device and the data being available can vary from read to read, thereby making data retrieval from the storage class memory device non-deterministic. In contrast, an amount of time between requesting data from a DRAM device and the data being available can remain fixed from read to read, thereby making data retrieval from a DRAM device deterministic.

In addition, because of the distinction between the deterministic behavior of volatile memory resources and the non-deterministic behavior of non-volatile memory resources, data that is transferred to and from the memory resources generally traverses a particular interface (e.g., a bus) that is associated with the type of memory being used. For example, data that is transferred to and from a DRAM device is typically passed via a double data rate (DDR) bus, while data that is transferred to and from a NAND device is typically passed via a peripheral component interconnect express (PCI-e) bus. As will be appreciated, examples of interfaces over which data can be transferred to and from a volatile memory resource and a non-volatile memory resource are not limited to these specific enumerated examples, however.

Because of the different behaviors of non-volatile memory device and volatile memory devices, some approaches opt to store certain types of data in either volatile or non-volatile memory. This can mitigate issues that can arise due to, for example, the deterministic behavior of volatile memory devices compared to the non-deterministic behavior of non-volatile memory devices. For example, computing systems in some approaches store small amounts of data that are regularly accessed during operation of the computing system in volatile memory devices while data that is larger or accessed less frequently is stored in a non-volatile memory device. However, in multi-user network deployments, the vast majority of data may be stored in volatile memory devices. In contrast, embodiments herein can allow for data storage and retrieval from a non-volatile memory device deployed in a multi-user network.

As described herein, some embodiments of the present disclosure are directed to computing systems in which data from a non-volatile, and hence, non-deterministic, memory resource is passed via an interface that is restricted to use by a volatile and deterministic memory resource in other approaches. For example, in some embodiments, data may be transferred to and from a non-volatile, non-deterministic memory resource, such as a NAND flash device, a resistance variable memory device, such as a phase change memory device and/or a resistive memory device (e.g., a three-dimensional Crosspoint (3D XP) memory device), a solid-state drive (SSD), a self-selecting memory (SSM) device, etc. via an interface such as a DDR interface that is reserved for data transfer to and from a volatile, deterministic memory resource in some approaches. Accordingly, in contrast to approaches in which volatile, deterministic memory devices are used to provide main memory to a computing system, embodiments herein can allow for non-volatile, non-deterministic memory devices to be used as at least a portion of the main memory for a computing system.

In some embodiments, the data may be intermediately transferred from the non-volatile memory resource to a cache (e.g., a small static random-access memory (SRAM) cache) or buffer and subsequently made available to the application that requested the data. By storing data that is normally provided in a deterministic fashion in a non-deterministic memory resource and allowing access to that data as described here, computing system performance may be improved by, for example, allowing for a larger amount of memory resources to be made available to a multi-user network at a substantially reduced cost in comparison to approaches that operate using volatile memory resources.

In order to facilitate embodiments of the present disclosure, visibility to the non-volatile memory resources may be obfuscated to various devices of the computing system in which the hierarchical memory apparatus is deployed. For example, host(s), network interface card(s), virtual machine(s), etc. that are deployed in the computing system or multi-user network may be unable to distinguish between whether data is stored by a volatile memory resource or a non-volatile memory resource of the computing system. For example, hardware circuitry may be deployed in the computing system that can register addresses that correspond to the data in such a manner that the host(s), network interface card(s), virtual machine(s), etc. are unable to distinguish whether the data is stored by volatile or non-volatile memory resources.

As described in more detail herein, a hierarchical memory apparatus may include hardware circuitry (e.g., logic circuitry) of a state machine that can receive redirected data requests, register an address in the logic circuitry associated with the requested data (despite the circuitry not being backed up by its own memory resource to store the data), and map, using the logic circuitry, the address registered in the logic circuitry to a physical address corresponding to the data in a non-volatile memory device. The state machine can be coupled to a multiplexer that assists the state machine in performing the above described operations.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" can refer to one or more of such things (e.g., a number of memory banks can refer to one or more memory banks), whereas a "plurality of" is intended to refer to more than one of such things.

Furthermore, the words "can" and "may" are used throughout this application in a permissive sense (e.g., having the potential to, being able to), not in a mandatory sense (e.g., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 104 may reference element "04" in FIG. 1, and a similar element may be referenced as 204 in FIG. 2. A group or plurality of similar elements or components may generally be referred to herein with a single element number. For example, a plurality of reference elements 106-1, 106-2, . . . , 106-N (e.g., 106-1 to 106-N) may be referred to generally as 106. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram of a hierarchical memory apparatus 104 in accordance with a number of embodiments of the present disclosure. Hierarchical memory apparatus 104 can be part of a computing system, as will be further described herein. As used herein, an "apparatus" can refer to, but is not limited to, any of a variety of structures or combinations of structures, such as a circuit or circuitry, a die or dice, a module or modules, a device or devices, or a system or systems, for example. In some embodiments, the hierarchical memory apparatus 104 can be provided as a field programmable gate array (FPGA), application-specific integrated circuit (ASIC), a number of discrete circuit components, etc., and can be referred to herein in the alternative as "logic circuitry."

The hierarchical memory apparatus 104 can, as illustrated in FIG. 1, include a memory resource 102, which can include a read buffer 103, a write buffer 105, and/or an input/output (I/O) device access component 107. In some embodiments, the memory resource 102 can be a random-access memory resource, such as a block RAM, which can allow for data to be stored within the hierarchical memory apparatus 104 in embodiments in which the hierarchical memory apparatus 104 is a FPGA. However, embodiments are not so limited, and the memory resource 102 can comprise various registers, caches, memory arrays, latches, and SRAM, DRAM, EPROM, or other suitable memory technologies that can store data such as bit strings that include registered addresses that correspond to physical locations in which data is stored external to the hierarchical memory apparatus 104. The memory resource 102 is internal to the hierarchical memory apparatus 104 and is generally smaller than memory that is external to the hierarchical memory apparatus 104, such as persistent and/or non-persistent memory resources that can be external to the hierarchical memory apparatus 104.

The read buffer 103 can include a portion of the memory resource 102 that is reserved for storing data that has been received by the hierarchical memory apparatus 104 but has not been processed by the hierarchical memory apparatus 104. For instance, the read buffer may store data that has been received by the hierarchical memory apparatus 104 in association with (e.g., during and/or as a part of) a sense (e.g., read) operation being performed on memory (e.g., persistent memory) that is external to the hierarchical memory apparatus 104. In some embodiments, the read buffer 103 can be around 4 Kilobytes (KB) in size, although embodiments are not limited to this particular size. The read buffer 103 can buffer data that is to be registered in one of the address registers 106-1 to 106-N.

The write buffer 105 can include a portion of the memory resource 102 that is reserved for storing data that is awaiting transmission to a location external to the hierarchical memory apparatus 104. For instance, the write buffer may store data that is to be transmitted to memory (e.g., persistent memory) that is external to the hierarchical memory apparatus 104 in association with a program (e.g., write) operation being performed on the external memory. In some embodiments, the write buffer 105 can be around 4 Kilobytes (KB) in size, although embodiments are not limited to this particular size. The write buffer 103 can buffer data that is registered in one of the address registers 106-1 to 106-N.

Figure 3:
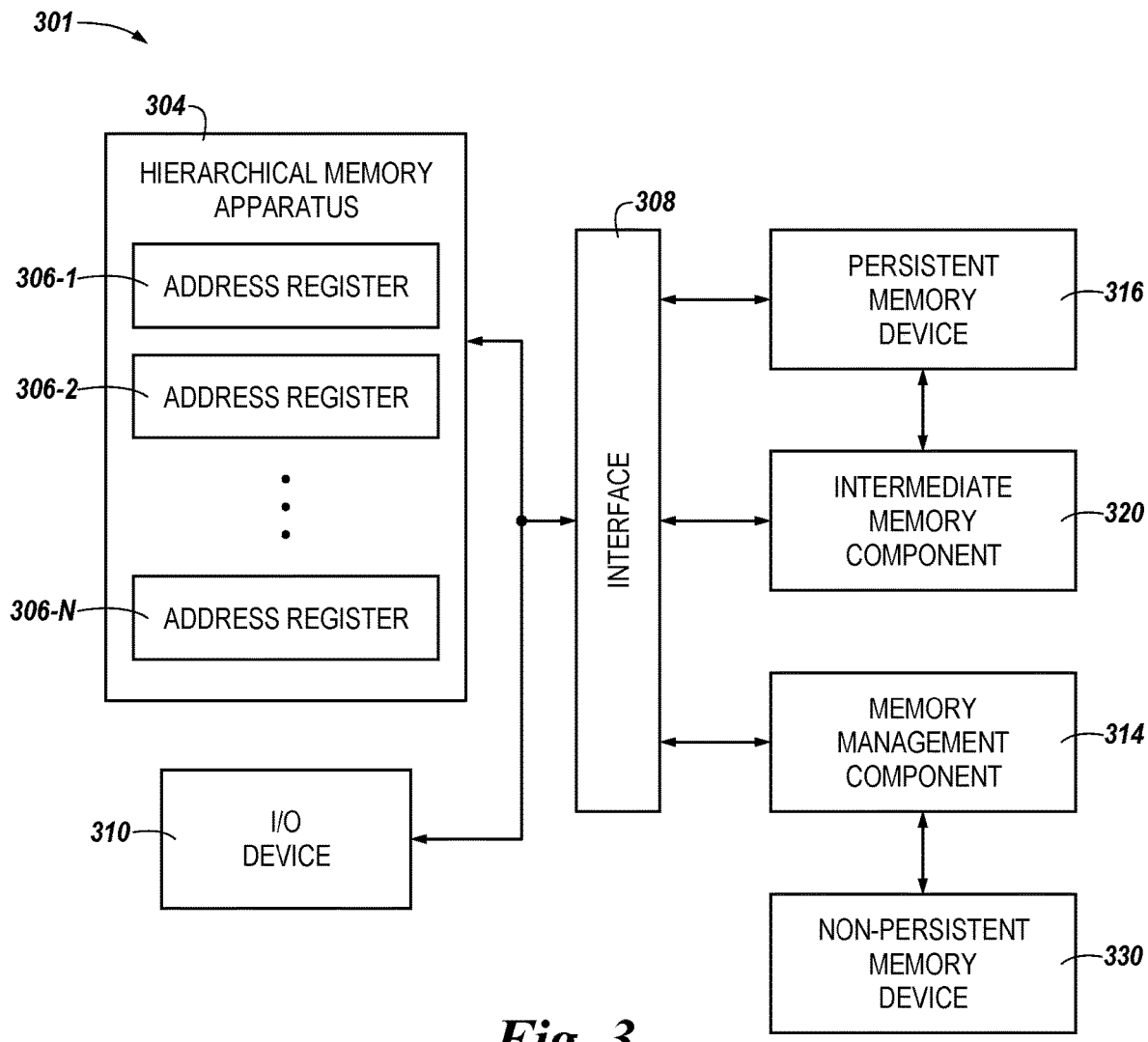
FIG. 3 is a functional block diagram in the form of a computing system including a hierarchical memory apparatus in accordance with a number of embodiments of the present disclosure.
Figure 4:
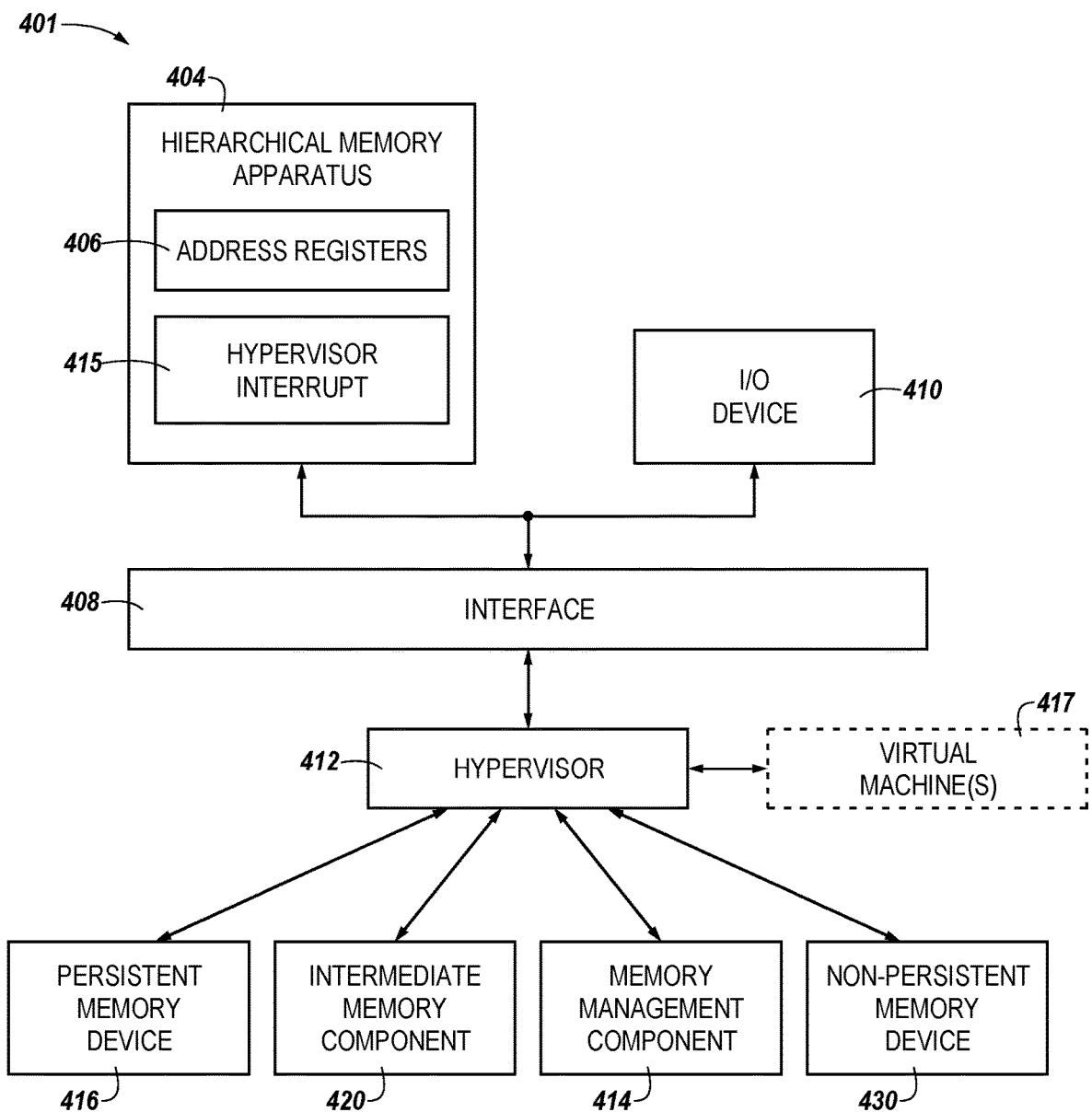
FIG. 4 is another functional block diagram in the form of a computing system including a hierarchical memory apparatus in accordance with a number of embodiments of the present disclosure.

The I/O access component 107 can include a portion of the memory resource 102 that is reserved for storing data that corresponds to access to a component external to the hierarchical memory apparatus 104, such as the I/O device 310/410 illustrated in FIGS. 3 and 4, herein. The I/O access component 107 can store data corresponding to addresses of the I/O device, which can be used to read and/or write data to and from the I/O device. In addition, the I/O access component 107 can, in some embodiments, receive, store, and/or transmit data corresponding to a status of a hypervisor (e.g., the hypervisor 412 illustrated in FIG. 4), as described in more detail in connection with FIG. 4, herein.

The hierarchical memory apparatus 104 can further include a memory access multiplexer (MUX) 109, a state machine 111, and/or a hierarchical memory controller 113 (or, for simplicity, "controller"). As shown in FIG. 1, the hierarchical memory controller 113 can include a plurality of address registers 106-1 to 106-N and/or an interrupt component 115. The memory access MUX 109 can include circuitry that can comprise one or more logic gates and can be configured to control data and/or address bussing for the hierarchical memory apparatus 104. For example, the memory access MUX 109 can transfer messages to and from the memory resource 102, as well as communicate with the hierarchical memory controller 113 and/or the state machine 111, as described in more detail below.

In some embodiments, the MUX 109 can redirect incoming messages and/or commands from a host (e.g., a host computing device, virtual machine, etc.) received to the hierarchical memory apparatus 104. For example, the MUX 109 can redirect an incoming message corresponding to an access (e.g., read) or program (e.g., write) request from an input/output (I/O) device (e.g., the I/O device 310/410 illustrated in FIGS. 3 and 4, herein) to one of the address registers (e.g., the address register 106-N, which can be a BAR4 region of the hierarchical memory controller 113, as described below) to the read buffer 103 and/or the write buffer 105.

In addition, the MUX 109 can redirect requests (e.g., read requests, write requests) received by the hierarchical memory apparatus 104. In some embodiments, the requests can be received by the hierarchical memory apparatus 104 from a hypervisor (e.g., the hypervisor 412 illustrated in FIG. 4, herein), a bare metal server, or host computing device communicatively coupled to the hierarchical memory apparatus 104. Such requests may be redirected by the MUX 109 from the read buffer 103, the write buffer 105, and/or the I/O access component 107 to an address register (e.g., the address register 106-2, which can be a BAR2 region of the hierarchical memory controller 113, as described below).

The MUX 109 can redirect such requests as part of an operation to determine an address in the address register(s) 106 that is to be accessed. In some embodiments, the MUX 109 can redirect such requests as part of an operation to determine an address in the address register(s) that is to be accessed in response to assertion of a hypervisor interrupt (e.g., an interrupt asserted to a hypervisor coupled to the hierarchical memory apparatus 104 that is generated by the interrupt component 115).

In response to a determination that the request corresponds to data associated with an address being written to a location external to the hierarchical memory apparatus 104 (e.g., to a persistent memory device such as the persistent memory device 316/416 illustrated in FIGS. 3 and 4, herein), the MUX 109 can facilitate retrieval of the data, transfer of the data to the write buffer 105, and/or transfer of the data to the location external to the hierarchical memory apparatus 104. In response to a determination that the request corresponds to data being read from a location external to the hierarchical memory apparatus 104 (e.g., from the persistent memory device), the MUX 109 can facilitate retrieval of the data, transfer of the data to the read buffer 103, and/or transfer of the data or address information associated with the data to a location internal to the hierarchical memory apparatus 104, such as the address register(s) 106.

As a non-limiting example, if the hierarchical memory apparatus 104 receives a read request from the I/O device, the MUX 109 can facilitate retrieval of data from a persistent memory device via the hypervisor by selecting the appropriate messages to send from the hierarchical memory apparatus 104. For example, the MUX 109 can facilitate generation of an interrupt using the interrupt component 115, cause the interrupt to be asserted on the hypervisor, buffer data received from the persistent memory device into the read buffer 103, and/or respond to the I/O device with an indication that the read request has been fulfilled. In a non-limiting example in which the hierarchical memory apparatus 104 receives a write request from the I/O device, the MUX 109 can facilitate transfer of data to a persistent memory device via the hypervisor by selecting the appropriate messages to send from the hierarchical memory apparatus 104. For example, the MUX 109 can facilitate generation of an interrupt using the interrupt component 115, cause the interrupt to be asserted on the hypervisor, buffer data to be transferred to the persistent memory device into the write buffer 105, and/or respond to the I/O device with an indication that the write request has been fulfilled. Examples of such retrieval and transfer of data in response to receipt of a read and write request, respectively, will be further described herein.

The state machine 111 can include one or more processing devices, circuit components, and/or logic that are configured to perform operations on an input and produce an output. In some embodiments, the state machine 111 can be a finite state machine (FSM) or a hardware state machine that can be configured to receive changing inputs and produce a resulting output based on the received inputs. For example, the state machine 111 can transfer access info (e.g., "I/O ACCESS INFO") to and from the memory access multiplexer 109, as well as interrupt configuration information (e.g., "INTERRUPT CONFIG") and/or interrupt request messages (e.g., "INTERRUPT REQUEST") to and from the hierarchical memory controller 113. In some embodiments, the state machine 111 can further transfer control messages (e.g., "MUX CTRL") to and from the memory access multiplexer 109.

The ACCESS INFO message can include information corresponding to a data access request received from an I/O device external to the hierarchical memory apparatus 104. In some embodiments, the ACCESS INFO can include logical addressing information that corresponds to data that is to be stored in a persistent memory device or addressing information that corresponds to data that is to be retrieved from the persistent memory device.

The INTERRUPT CONFIG message can be asserted by the state machine 111 on the hierarchical memory controller 113 to configure appropriate interrupt messages to be asserted external to the hierarchical memory apparatus 104. For example, when the hierarchical memory apparatus 104 asserts an interrupt on a hypervisor coupled to the hierarchical memory apparatus 104 as part of fulfilling a redirected read or write request, the INTERRUPT CONFIG message can generated by the state machine 111 to generate an appropriate interrupt message based on whether the operation is an operation to retrieve data from a persistent memory device or an operation to write data to the persistent memory device.

The INTERRUPT REQUEST message can be generated by the state machine 111 and asserted on the interrupt component 115 to cause an interrupt message to be asserted on the hypervisor (or bare metal server or other computing device). As described in more detail herein, the interrupt 115 can be asserted on the hypervisor to cause the hypervisor to prioritize data retrieval or writing of data to the persistent memory device as part of operation of a hierarchical memory system.

The MUX CTRL message(s) can be generated by the state machine 111 and asserted on the MUX 109 to control operation of the MUX 109. In some embodiments, the MUX CTRL message(s) can be asserted on the MUX 109 by the state machine 111 (or vice versa) as part of performance of the MUX 109 operations described above.

The hierarchical memory controller 113 can include a core, such as an integrated circuit, chip, system-on-a-chip, or combinations thereof. In some embodiments, the hierarchical memory controller 113 can be a peripheral component interconnect express (PCIe) core. As used herein, a "core" refers to a reusable unit of logic, processor, and/or co-processors that receive instructions and perform tasks or actions based on the received instructions.

The hierarchical memory controller 113 can include address registers 106-1 to 106-N and/or an interrupt component 115. The address registers 106-1 to 106-N can be base address registers (BARs) that can store memory addresses used by the hierarchical memory apparatus 104 or a computing system (e.g., the computing system 301/401 illustrated in FIGS. 3 and 4, herein). At least one of the address registers (e.g., the address register 106-1) can store memory addresses that provide access to the internal registers of the hierarchical memory apparatus 104 from an external location such as the hypervisor 412 illustrated in FIG. 4.

A different address register (e.g., the address register 106-2) can be used to store addresses that correspond to interrupt control, as described in more detail herein. In some embodiments, the address register 106-2 can map direct memory access (DMA) read and DMA write control and/or status registers. For example, the address register 106-2 can include addresses that correspond to descriptors and/or control bits for DMA command chaining, which can include the generation of one or more interrupt messages that can be asserted to a hypervisor as part of operation of a hierarchical memory system, as described in connection with FIG. 4, herein.

Yet another one of the address registers (e.g., the address register 106-3) can store addresses that correspond to access to and from a hypervisor (e.g., the hypervisor 412 illustrated in FIG. 4, herein). In some embodiments, access to and/or from the hypervisor can be provided via an Advanced eXtensible Interface (AXI) DMA associated with the hierarchical memory apparatus 104. In some embodiments, the address register can map addresses corresponding to data transferred via a DMA (e.g., an AXI DMA) of the hierarchical memory apparatus 104 to a location external to the hierarchical memory apparatus 104.

In some embodiments, at least one address register (e.g., the address register 106-N) can store addresses that correspond to I/O device (e.g., the I/O device 310/410 illustrated in FIG. 3/4) access information (e.g., access to the hierarchical memory apparatus 104). The address register 106-N may store addresses that are bypassed by DMA components associated with the hierarchical memory apparatus 104. The address register 106-N can be provided such that addresses mapped thereto are not "backed up" by a physical memory location of the hierarchical memory apparatus 104. That is, in some embodiments, the hierarchical memory apparatus 104 can be configured with an address space that stores addresses (e.g., logical addresses) that correspond to a persistent memory device and/or data stored in the persistent memory device (e.g., the persistent memory device 316/416 illustrated in FIGS. 3/4), and not to data stored by the hierarchical memory apparatus 104. Each respective address can correspond to a different location in the persistent memory device and/or the location of a different portion of the data stored in the persistent memory device. For example, the address register 106-N can be configured as a virtual address space that can store logical addresses that correspond to the physical memory locations (e.g., in a memory device) to which data could be programed or in which data is stored.

In some embodiments, the address register 106-N can include a quantity of address spaces that correspond to a size of a memory device (e.g., the persistent memory device 316/416 illustrated in FIGS. 3 and 4, herein). For example, if the memory device contains one terabyte of storage, the address register 106-N can be configured to have an address space that can include one terabyte of address space. However, as described above, the address register 106-N does not actually include one terabyte of storage and instead is configured to appear to have one terabyte of storage space.

As an example, hierarchical memory apparatus 104 (e.g., MUX 109 and/or state machine 111) can receive a first request to access (e.g., read) a portion of data stored in a persistent memory device. In some embodiments, the persistent memory device can be external to the hierarchical memory apparatus 104. For instance, the persistent memory device can be persistent memory device 316/416 illustrated in FIGS. 3/4. However, in some embodiments, the persistent memory device may be included in (e.g., internal to) the hierarchical memory apparatus 104.

Hierarchical memory apparatus 104 can receive the first request, for example, from memory management circuitry via an interface (e.g., from memory management circuitry 314/414 via interface 308/408 illustrated in FIGS. 3 and 4, herein). The first request can be, for example, a redirected request from an I/O device (e.g., I/O device 310/410 illustrated in FIGS. 3 and 4, herein).

In response to receiving the first request, hierarchical memory apparatus 104 can determine the address in the persistent memory device corresponding to the portion of data (e.g., the location of the data in the persistent memory device) using address register 106-N. For instance, MUX 109 and/or state machine 111 can access register 106-N to retrieve (e.g., capture) the address from register 106-N. Hierarchical memory apparatus 104 (e.g., MUX 109 and/or state machine 111) can also detect access to the I/O device in response to receiving the first request, and receive (e.g., capture) I/O device access information corresponding to the first request from the I/O device, including for instance, virtual I/O device access information. The I/O device access information can be stored in register 106-N and/or I/O access component 107 (e.g., the virtual I/O device access information can be stored in I/O access component 107). Further, in some embodiments, hierarchical memory apparatus 104 can associate information with the portion of data that indicates the portion of data is inaccessible by a non-persistent memory device (e.g., non-persistent memory device 330/430 illustrated in FIGS. 3 and 4, herein).

Hierarchical memory apparatus 104 (e.g., MUX 109 and/or state machine 111) can then generate a second request to access (e.g., read) the portion of the data. The second request can include the address in the persistent memory device determined to correspond to the data (e.g., the address indicating the location of the data in the persistent memory device). Along with the second request, hierarchical memory apparatus 104 can also generate an interrupt signal (e.g., message) using address register 106-2. For instance, MUX 109 and/or state machine 111 can generate the interrupt signal by accessing address register 102 and using interrupt component 115.

Hierarchical memory apparatus 104 (e.g., MUX 109 and/or state machine 111) can then send the interrupt signal and the second request to access the portion of the data to the persistent memory device. For instance, the interrupt signal can be sent as part of the second request. In embodiments in which the persistent memory device is external to the hierarchical memory apparatus 104, the interrupt signal and second request can be sent via the interface through which the first request was received (e.g., via interface 308/408 illustrated in FIGS. 3 and 4, herein). As an additional example, in embodiments in which the persistent memory device is included in the hierarchical memory apparatus 104, the interrupt signal may be sent via the interface, while the second request can be sent directly to the persistent memory device. Further, hierarchical memory apparatus 104 can also send, via the interface, the I/O device access information from register 106-N and/or virtual I/O device access information from I/O access component 107 as part of the second request.

After sending the interrupt signal and second request, hierarchical memory apparatus 104 may receive the portion of the data from (e.g., read from) the persistent memory device. For instance, in embodiments in which the persistent memory device is external to hierarchical memory apparatus 104, the data may be received from the persistent memory device via the interface, and in embodiments in which the persistent memory device is included in the hierarchical memory apparatus 104, the data may be received directly from the persistent memory device. After receiving the portion of the data, hierarchical memory apparatus 104 can send the data to the I/O device (e.g., I/O device 310/410 illustrated in FIGS. 3 and 4, herein). Further, hierarchical memory apparatus 104 can store the data in read buffer 103 (e.g., prior to sending the data to the I/O device).

As an additional example, hierarchical memory apparatus 104 (e.g., MUX 109 and/or state machine 111) can receive a first request to program (e.g., write) data to the persistent memory device. The request can be received, for example, from memory management circuitry via an interface (e.g., from memory management circuitry 314/414 via interface 308/408 illustrated in FIGS. 3 and 4, herein), and can be a redirected request from an I/O device (e.g., I/O device 310/410 illustrated in FIGS. 3 and 4, herein), in a manner analogous to the first access request previously described herein. The data to be programmed to the persistent memory device can be stored in write buffer 105 (e.g., before being sent to the persistent memory device to be programmed).

In response to receiving the first request, hierarchical memory apparatus 104 can determine an address in the persistent memory device corresponding to the data (e.g., the location in the persistent memory device to which the data is to be programmed) using address register 106-N. For instance, MUX 109 and/or state machine 111 can access register 106-N to retrieve (e.g., capture) the address from register 106-N. Hierarchical memory apparatus 104 (e.g., MUX 109 and/or state machine 111) can also detect access to the I/O device in response to receiving the first request, and receive (e.g., capture) I/O device access information corresponding to the first request from the I/O device, including for instance, virtual I/O device access information. The I/O device access information can be stored in register 106-N and/or I/O access component 107 (e.g., the virtual I/O device access information can be stored in I/O access component 107). Further, in some embodiments, hierarchical memory apparatus 104 can associate information with the data that indicates the data is inaccessible by a non-persistent memory device (e.g., non-persistent memory device 330/430 illustrated in FIGS. 3 and 4, herein) in response to receiving the first request.

Hierarchical memory apparatus 104 (e.g., MUX 109 and/or state machine 111) can then generate a second request to program (e.g., write) the data to the persistent memory device. The second request can include the data to be programmed to the persistent memory device, and the address in the persistent memory device determined to correspond to the data (e.g., the address to which the data is to be programmed). Along with the second request, hierarchical memory apparatus 104 can also generate an interrupt signal (e.g., message) using address register 106-2, in a manner analogous to that previously described for the second access request.

Hierarchical memory apparatus 104 (e.g., MUX 109 and/or state machine 111) can then send the interrupt signal and the second request to program the data to the persistent memory device. For instance, the interrupt signal can be sent as part of the second request. In embodiments in which the persistent memory device is external to the hierarchical memory apparatus 104, the interrupt signal and second request can be sent via the interface through which the first request was received (e.g., via interface 308/408 illustrated in FIGS. 3 and 4, herein). As an additional example, in embodiments in which the persistent memory device is included in the hierarchical memory apparatus 104, the interrupt signal may be sent via the interface, while the second request can be sent directly to the persistent memory device. Further, hierarchical memory apparatus 104 can also send, via the interface, the I/O device access information from register 106-N and/or virtual I/O device access information from I/O access component 107 as part of the second request.

Although not explicitly shown in FIG. 1, the hierarchical memory apparatus 104 can be coupled to a host computing system. The host computing system can include a system motherboard and/or backplane and can include a number of processing resources (e.g., one or more processors, microprocessors, or some other type of controlling circuitry). The host and the hierarchical memory apparatus 104 can be, for instance, a server system and/or a high-performance computing (HPC) system and/or a portion thereof. In some embodiments, the computing system can have a Von Neumann architecture, however, embodiments of the present disclosure can be implemented in non-Von Neumann architectures, which may not include one or more components (e.g., CPU, ALU, etc.) often associated with a Von Neumann architecture.

Figure 2:
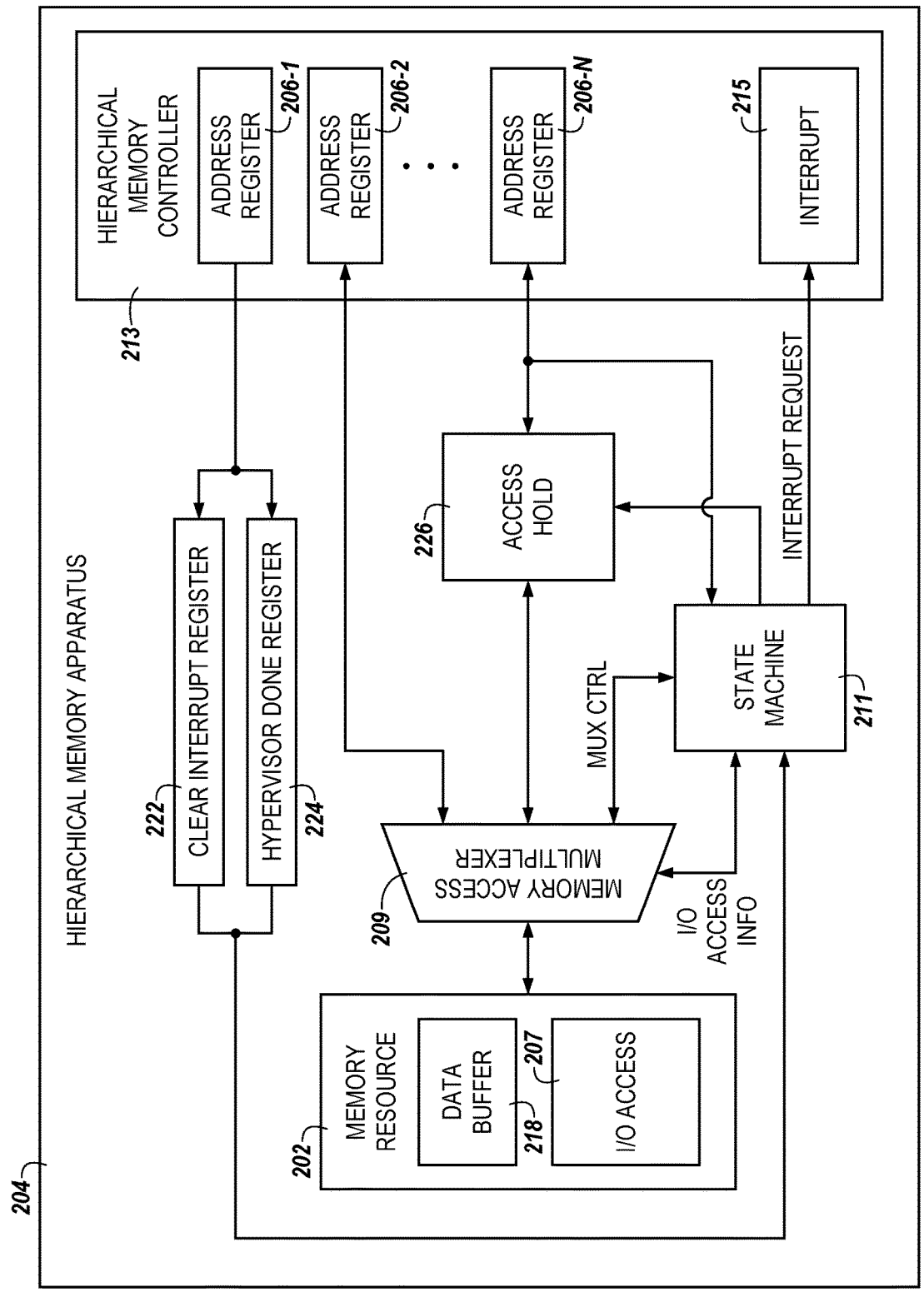
FIG. 2 is a functional block diagram of a hierarchical memory apparatus in accordance with a number of embodiments of the present disclosure.

FIG. 2 is a functional block diagram of a hierarchical memory apparatus 204 in accordance with a number of embodiments of the present disclosure. Hierarchical memory apparatus 204 can be part of a computing system, and/or can be provided as an FPGA, an ASIC, a number of discrete circuit components, etc., in a manner analogous to hierarchical memory apparatus 104 previously described in connection with FIG. 1.

The hierarchical memory apparatus 204 can, as illustrated in FIG. 2, include a memory resource 202, which can include a data buffer 218 and/or an input/output (I/O) device access component 207. Memory resource 202 can be analogous to memory resource 102 previously described in connection with FIG. 1, except that data buffer 218 can replace read buffer 103 and write buffer 105. For instance, the functionality previously described in connection with read buffer 103 and write buffer 105 can be combined into that of data buffer 218. In some embodiments, the data buffer 218 can be around 4 KB in size, although embodiments are not limited to this particular size.

The hierarchical memory apparatus 104 can further include a memory access multiplexer (MUX) 109, a state machine 111, and/or a hierarchical memory controller 113 (or, for simplicity, "controller"). As shown in FIG. 1, the hierarchical memory controller 113 can include a plurality of address registers 106-1 to 106-N and/or an interrupt component 115. The memory access MUX 109 can include circuitry that can comprise one or more logic gates and can be configured to control data and/or address bussing for the hierarchical memory apparatus 104. For example, the memory access MUX 109 can transfer messages to and from the memory resource 102, as well as communicate with the hierarchical memory controller 113 and/or the state machine 111, as described in more detail below.

The hierarchical memory apparatus 204 can further include a memory access multiplexer (MUX) 209, a state machine 211, and/or a hierarchical memory controller 213 (or, for simplicity, "controller"). As shown in FIG. 1, the hierarchical memory controller 113 can include a plurality of address registers 206-1 to 206-N and/or an interrupt component 115.

The memory access MUX 209 can include circuitry analogous to that of MUX 109 previously described in connection with FIG. 1, and can redirect incoming messages, commands, and/or requests (e.g., read and/or write requests), received by the hierarchical memory apparatus 204 (e.g., from a host, an I/O device, or a hypervisor), in a manner analogous to that previously described for MUX 109. For example, the MUX 209 can redirect such requests as part of an operation to determine an address in the address register(s) 106 that is to be accessed, as previously described in connection with FIG. 1. For instance, in response to a determination that the request corresponds to data associated with an address being written to a location external to the hierarchical memory apparatus 204, the MUX 209 can facilitate retrieval of the data, transfer of the data to the data buffer 218, and/or transfer of the data to the location external to the hierarchical memory apparatus 204, as previously described in connection with FIG. 1. Further, in response to a determination that the request corresponds to data being read from a location external to the hierarchical memory apparatus 204, the MUX 209 can facilitate retrieval of the data, transfer of the data to the data buffer 218, and/or transfer of the data or address information associated with the data to a location internal to the hierarchical memory apparatus 204, such as the address register(s) 206, as previously described in connection with FIG. 1.

The state machine 211 can include one or more processing devices, circuit components, and/or logic that are configured to perform operations on an input and produce an output in a manner analogous to that of state machine 111 previously described in connection with FIG. 1. For example, the state machine 211 can transfer access info (e.g., "I/O ACCESS INFO") and control messages (e.g., "MUX CTRL") to and from the memory access multiplexer 209, and/or interrupt request messages (e.g., "INTERRUPT REQUEST") to and from the hierarchical memory controller 213, as previously described in connection with FIG. 1. However, in contrast to state machine 111, it is noted that state machine 211 may not transfer interrupt configuration information (e.g., "INTERRUPT CONFIG") to and from controller 213.

The hierarchical memory controller 213 can include a core, in a manner analogous to that of controller 113 previously described in connection with FIG. 1. In some embodiments, the hierarchical memory controller 213 can be a PCIe core, in a manner analogous to controller 113.

The hierarchical memory controller 213 can include address registers 206-1 to 206-N and/or an interrupt component 215. The address registers 206-1 to 206-N can be base address registers (BARs) that can store memory addresses used by the hierarchical memory apparatus 204 or a computing system (e.g., the computing system 301/401 illustrated in FIGS. 3 and 4, herein).

At least one of the address registers (e.g., the address register 206-1) can store memory addresses that provide access to the internal registers of the hierarchical memory apparatus 204 from an external location such as the hypervisor 412 illustrated in FIG. 4, in a manner analogous to that of address register 106-1 previously described in connection with FIG. 1. Yet another one of the address registers (e.g., the address register 206-2) can store addresses that correspond to access to and from a hypervisor, in a manner analogous to that of address register 106-3 previously described in connection with FIG. 1. Further, at least one address register (e.g., the address register 206-N) can store addresses and include address spaces in a manner analogous to that of address register 106-N previously described in connection with FIG. 1. However, in contrast to controller 113, it is noted that controller 213 may not include an address register analogous to address register 106-2 that can store addresses that correspond to interrupt control and map DMA read and DMA write control and/or status registers, as described in connection with FIG. 1.

As shown in FIG. 2 (and in contrast to hierarchical memory apparatus 104), hierarchical memory apparatus 204 can include a clear interrupt register 222 and a hypervisor done register 224. Clear interrupt register 222 can store an interrupt signal generated by interrupt component 215 as part of a request to read or write data, as previously described herein, and hypervisor done register 224 can provide an indication (e.g., to state machine 211) that the hypervisor (e.g., hypervisor 412 illustrated in FIG. 4) is accessing the internal registers of hierarchical memory apparatus 204 to map the addresses to read or write the data, as previously described herein. Once the read or write request has been completed, the interrupt signal can be cleared from register 222, and register 224 can provide an indication (e.g., to state machine 211) that the hypervisor is no longer accessing the internal registers of hierarchical memory apparatus 204.

As shown in FIG. 2 (and in contrast to hierarchical memory apparatus 104), hierarchical memory apparatus 204 can include an access hold component 226. Access hold component 226 can limit the address space of address register 206-N. For instance, access hold component 226 can limit the addresses of address register 206-N to lower than 4 k.

Although not explicitly shown in FIG. 2, the hierarchical memory apparatus 204 can be coupled to a host computing system, in a manner analogous to that described for hierarchical memory apparatus 104. The host and the hierarchical memory apparatus 204 can be, for instance, a server system and/or a high-performance computing (HPC) system and/or a portion thereof, as described in connection with FIG. 1.

FIG. 3 is a functional block diagram in the form of a computing system 301 including a hierarchical memory apparatus 304 in accordance with a number of embodiments of the present disclosure. Hierarchical memory apparatus 304 can be analogous to the hierarchical memory apparatus 104 and/or 204 illustrated in FIGS. 1 and 2, respectively. In addition, the computing system 201 can include an input/output (I/O) device 310, a persistent memory device 316, a non-persistent memory device 330, an intermediate memory component 320, and a memory management component 314. Communication between the hierarchical memory apparatus 304, the I/O device 310 and the persistent memory device 316, the non-persistent memory device 230, and the memory management component 314 may be facilitated via an interface 308.

The I/O device 310 can be a device that is configured to provide direct memory access via a physical address and/or a virtual machine physical address. In some embodiments, the I/O device 310 can be a network interface card (NIC) or network interface controller, a storage device, a graphics rendering device, or other I/O device. The I/O device 310 can be a physical I/O device or the I/O device 310 can be a virtualized I/O device 310. For example, in some embodiments, the I/O device 310 can be a physical card that is physically coupled to a computing system via a bus or interface such as a PCIe interface or other suitable interface. In embodiments in which the I/O device 310 is a virtualized I/O device 310, the virtualized I/O device 310 can provide I/O functionality in a distributed manner.

The persistent memory device 316 can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes.

The persistent memory device 316 can include volatile memory and/or non-volatile memory. In a number of embodiments, the persistent memory device 316 can include a multi-chip device. A multi-chip device can include a number of different memory types and/or memory modules. For example, a memory system can include non-volatile or volatile memory on any type of a module. In embodiments in which the persistent memory device 316 includes non-volatile memory, the persistent memory device 316 can be a flash memory device such as NAND or NOR flash memory devices.

Embodiments are not so limited, however, and the persistent memory device 316 can include other non-volatile memory devices such as non-volatile random-access memory devices (e.g., NVRAM, ReRAM, FeRAM, MRAM, PCM), "emerging" memory devices such as resistance variable memory devices (e.g., resistive and/or phase change memory devices such as a 3D Crosspoint (3D XP) memory device), memory devices that include an array of self-selecting memory (SSM) cells, etc., or combinations thereof. A resistive and/or phase change array of non-volatile memory can perform bit storage based on a change of bulk resistance, in conjunction with a stackable cross-gridded data access array. Additionally, in contrast to many flash-based memories, resistive and/or phase change memory devices can perform a write in-place operation, where a non-volatile memory cell can be programmed without the non-volatile memory cell being previously erased. In contrast to flash-based memories, self-selecting memory cells can include memory cells that have a single chalcogenide material that serves as both the switch and storage element for the memory cell.

The persistent memory device 316 can provide a storage volume for the computing system 301 and can therefore be used as additional memory or storage throughout the computing system 301, main memory for the computing system 301, or combinations thereof. Embodiments are not limited to a particular type of memory device, however, and the persistent memory device 316 can include RAM, ROM, SRAM DRAM, SDRAM, PCRAM, RRAM, and flash memory, among others. Further, although a single persistent memory device 316 is illustrated in FIG. 3, embodiments are not so limited, and the computing system 301 can include one or more persistent memory devices 316, each of which may or may not have a same architecture associated therewith. As a non-limiting example, in some embodiments, the persistent memory device 316 can comprise two discrete memory devices that are different architectures, such as a NAND memory device and a resistance variable memory device.

The non-persistent memory device 330 can include volatile memory, such as an array of volatile memory cells. In a number of embodiments, the non-persistent memory device 330 can include a multi-chip device. A multi-chip device can include a number of different memory types and/or memory modules. In some embodiments, the non-persistent memory device 330 can serve as the main memory for the computing system 301. For example, the non-persistent memory device 330 can be a dynamic random-access (DRAM) memory device that is used to provide main memory to the computing system 301. Embodiments are not limited to the non-persistent memory device 330 comprising a DRAM memory device, however, and in some embodiments, the non-persistent memory device 330 can include other non-persistent memory devices such as RAM, SRAM DRAM, SDRAM, PCRAM, and/or RRAM, among others.

The non-persistent memory device 330 can store data that can be requested by, for example, a host computing device as part of operation of the computing system 301. For example, when the computing system 301 is part of a multi-user network, the non-persistent memory device 330 can store data that can be transferred between host computing devices (e.g., virtual machines deployed in the multi-user network) during operation of the computing system 301.

In some approaches, non-persistent memory such as the non-persistent memory device 330 can store all user data accessed by a host (e.g., a virtual machine deployed in a multi-user network). For example, due to the speed of non-persistent memory, some approaches rely on non-persistent memory to provision memory resources for virtual machines deployed in a multi-user network. However, in such approaches, costs can be become an issue due to non-persistent memory generally being more expensive than persistent memory (e.g., the persistent memory device 316).

In contrast, as described in more detail below, embodiments herein can allow for at least some data that is stored in the non-persistent memory device 330 to be stored in the persistent memory device 316. This can allow for additional memory resources to be provided to a computing system 301, such as a multi-user network, at a lower cost than approaches that rely on non-persistent memory for user data storage.

The computing system 301 can include a memory management component 314, which can be communicatively coupled to the non-persistent memory device 330 and/or the interface 308. In some embodiments, the memory management component 314 can be an input/output memory management unit (10 MMU) that can communicatively couple a direct memory access bus such as the interface 308 to the non-persistent memory device 330. Embodiments are not so limited, however, and the memory management component 314 can be other types of memory management hardware that facilitates communication between the interface 308 and the non-persistent memory device 330.

The memory management component 314 can map device-visible virtual addresses to physical addresses. For example, the memory management component 314 can map virtual addresses associated with the I/O device 310 to physical addresses in the non-persistent memory device 330 and/or the persistent memory device 316. In some embodiments, mapping the virtual entries associated with the I/O device 310 can be facilitated by the read buffer, write buffer, and/or I/O access buffer illustrated in FIG. 1, herein, or the data buffer and/or I/O access buffer illustrated in FIG. 2, herein.

In some embodiments, the memory management component 314 can read a virtual address associated with the I/O device 310 and/or map the virtual address to a physical address in the non-persistent memory device 330 or to an address in the hierarchical memory apparatus 304. In embodiments in which the memory management component 314 maps the virtual I/O device 310 address to an address in the hierarchical memory apparatus 304, the memory management component 314 can redirect a read request (or a write request) received from the I/O device 310 to the hierarchical memory apparatus 304, which can store the virtual address information associated with the I/O device 310 read or write request in an address register (e.g., the address register 306-N) of the hierarchical memory apparatus 304, as previously described in connection with FIGS. 1 and 2. In some embodiments, the address register 306-N can be a particular base address register of the hierarchical memory apparatus 304, such as a BAR4 address register.

The redirected read (or write) request can be transferred from the memory management component 314 to the hierarchical memory apparatus 304 via the interface 308. In some embodiments, the interface 308 can be a PCIe interface and can therefore pass information between the memory management component 314 and the hierarchical memory apparatus 304 according to PCIe protocols. Embodiments are not so limited, however, and in some embodiments the interface 308 can be an interface or bus that functions according to another suitable protocol.

After the virtual NIC address is stored in the hierarchical memory apparatus 304, the data corresponding to the virtual NIC address can be written to the persistent memory device 316. For example, the data corresponding to the virtual NIC address stored in the hierarchical memory apparatus 304 can be stored in a physical address location of the persistent memory device 316. In some embodiments, transferring the data to and/or from the persistent memory device 316 can be facilitated by a hypervisor, as described in connection with FIG. 4, herein.

When the data is requested by, for example, a host computing device, such as a virtual machine deployed in the computing system 301, the request can be redirected from the I/O device 310, by the memory management component 314, to the hierarchical memory apparatus 304. Because the virtual NIC address corresponding to the physical location of the data in the persistent memory device 316 is stored in the address register 306-N of the hierarchical memory apparatus 304, the hierarchical memory apparatus 304 can facilitate retrieval of the data from the persistent memory device 316, as previously described herein. For instance, hierarchical memory apparatus 304 can facilitate retrieval of the data from the persistent memory device 316 in connection with a hypervisor, as described in more detail in connection with FIG. 4, herein.

In some embodiments, when data that has been stored in the persistent memory device 316 is transferred out of the persistent memory device 316 (e.g., when data that has been stored in the persistent memory device 316 is requested by a host computing device), the data may be transferred to the intermediate memory component 320 and/or the non-persistent memory device 330 prior to being provided to the host computing device. For example, because data transferred to the host computing device may be transferred in a deterministic fashion (e.g., via a DDR interface), the data may be transferred temporarily to a memory that operates using a DDR bus, such as the intermediate memory component 320 and/or the non-persistent memory device 330, prior to a data request being fulfilled.

FIG. 4 is another functional block diagram in the form of a computing system including a hierarchical memory apparatus in accordance with a number of embodiments of the present disclosure. As shown in FIG. 4, the computing system 401 can include a hierarchical memory apparatus 404, which can be analogous to the hierarchical memory apparatus 104/204/304 illustrated in FIGS. 1, 2, and 3. In addition, the computing system 401 can include an I/O device 410, a persistent memory device 416, a non-persistent memory device 430, an intermediate memory component 420, a memory management component 414, and a hypervisor 412.

In some embodiments, the computing system 401 can be a multi-user network, such as a software defined data center, cloud computing environment, etc. In such embodiments, the computing system can be configured to have one or more virtual machines 417 running thereon. For example, in some embodiments, one or more virtual machines 417 can be deployed on the hypervisor 412 and can be accessed by users of the multi-user network.

The I/O device 410, the persistent memory device 416, the non-persistent memory device 430, the intermediate memory component 420, and the memory management component 414 can be analogous to the I/O device 310, the persistent memory device 316, the non-persistent memory device 330, the intermediate memory component 320, and the memory management component 314 illustrated in FIG. 3. Communication between the hierarchical memory apparatus 404, the I/O device 410 and the persistent memory device 416, the non-persistent memory device 430, the hypervisor 412, and the memory management component 414 may be facilitated via an interface 408, which may be analogous to the interface 308 illustrated in FIG. 3.

As described above in connection with FIG. 3, the memory management component 414 can cause a read request or a write request associated with the I/O device 410 to be redirected to the hierarchical memory apparatus 404. The hierarchical memory apparatus 404 can generate and/or store a logical address corresponding to the requested data. As described above, the hierarchical memory apparatus 404 can store the logical address corresponding to the requested data in a base address register, such as the address register 406-N of the hierarchical memory apparatus 404.

As shown in FIG. 4, the hypervisor 412 can be in communication with the hierarchical memory apparatus 404 and/or the I/O device 410 via the interface 408. The hypervisor 412 can transmit data between the hierarchical memory apparatus 404 via a NIC access component (e.g., the NIC access component 107/207 illustrated in FIGS. 1 and 2) of the hierarchical memory apparatus 404. In addition, the hypervisor 412 can be in communication with the persistent memory device 416, the non-persistent memory device 430, the intermediate memory component 420, and the memory management component 414. The hypervisor can be configured to execute specialized instructions to perform operations and/or tasks described herein.

For example, the hypervisor 412 can execute instructions to monitor data traffic and data traffic patterns to determine whether data should be stored in the non-persistent memory device 430 or if the data should be transferred to the persistent memory device 416. That is, in some embodiments, the hypervisor 412 can execute instructions to learn user data request patterns over time and selectively store portions of the data in the non-persistent memory device 430 or the persistent memory device 416 based on the patterns. This can allow for data that is accessed more frequently to be stored in the non-persistent memory device 430 while data that is accessed less frequently to be stored in the persistent memory device 416.

Because a user may access recently used or viewed data more frequently than data that has been used less recently or viewed less recently, the hypervisor can execute specialized instructions to cause the data that has been used or viewed less recently to be stored in the persistent memory device 416 and/or cause the data that has been accessed or viewed more recently in the non-persistent memory device 430. In a non-limiting example, a user may view photographs on social media that have been taken recently (e.g., within a week, etc.) more frequently than photographs that have been taken less recently (e.g., a month ago, a year ago, etc.). Based on this information, the hypervisor 412 can execute specialized instructions to cause the photographs that were viewed or taken less recently to be stored in the persistent memory device 416, thereby reducing an amount of data that is stored in the non-persistent memory device 430. This can reduce an overall amount of non-persistent memory that is necessary to provision the computing system 401, thereby reducing costs and allowing for access to the non-persistent memory device 430 to more users.

In operation, the computing system 401 can be configured to intercept a data request from the I/O device 410 and redirect the request to the hierarchical memory apparatus 404. In some embodiments, the hypervisor 412 can control whether data corresponding to the data request is to be stored in (or retrieved from) the non-persistent memory device 430 or in the persistent memory device 416. For example, the hypervisor 412 can execute instructions to selectively control if the data is stored in (or retrieved from) the persistent memory device 416 or the non-persistent memory device 430.

As part of controlling whether the data is stored in (or retrieved from) the persistent memory device 416 and/or the non-persistent memory device 430, the hypervisor 412 can cause the memory management component 414 to map logical addresses associated with the data to be redirected to the hierarchical memory apparatus 404 and stored in the address registers 406 of the hierarchical memory apparatus 404. For example, the hypervisor 412 can execute instructions to control read and write requests involving the data to be selectively redirected to the hierarchical memory apparatus 404 via the memory management component 414.

The memory management component 414 can map contiguous virtual addresses to underlying fragmented physical addresses. Accordingly, in some embodiments, the memory management component 414 can allow for virtual addresses to be mapped to physical addresses without the requirement that the physical addresses are contiguous. Further, in some embodiments, the memory management component 414 can allow for devices that do not support memory addresses long enough to address their corresponding physical memory space to be addressed in the memory management component 414.

Due to the non-deterministic nature of data transfer associated with the persistent memory device 416, the hierarchical memory apparatus 404 can, in some embodiments, be configured to inform the computing system 401 that a delay in transferring the data to or from the persistent memory device 316 may be incurred. As part of initializing the delay, the hierarchical memory apparatus 404 can provide page fault handling for the computing system 401 when a data request is redirected to the hierarchical memory apparatus 404. In some embodiments, the hierarchical memory apparatus 404 can generate and assert an interrupt to the hypervisor 412, as previously described herein, to initiate an operation to transfer data into or out of the persistent memory device 416. For example, due to the non-deterministic nature of data retrieval and storage associated with the persistent memory device 416, the hierarchical memory apparatus 404 can generate a hypervisor interrupt 415 when a transfer of the data that is stored in the persistent memory device 416 is requested.

In response to the page fault interrupt generated by the hierarchical memory apparatus 404, the hypervisor 412 can retrieve information corresponding to the data from the hierarchical memory apparatus 404. For example, the hypervisor 412 can receive NIC access data from the hierarchical memory apparatus, which can include logical to physical address mappings corresponding to the data that are stored in the address registers 406 of the hierarchical memory apparatus 404, as previously described herein.

Once the data has been stored in the persistent memory device 416, a portion of the non-persistent memory device 430 (e.g., a page, a block, etc.) can be marked as inaccessible by the hierarchical memory apparatus 404, as previously described herein, so that the computing system 401 does not attempt to access the data from the non-persistent memory device 430. This can allow a data request to be intercepted with a page fault, which can be generated by the hierarchical memory apparatus 404 and asserted to the hypervisor 412 when the data that has been stored in the persistent memory device 416 is requested by the I/O device 410.

In contrast to approaches in which a page fault exception is raised in response to an application requesting access to a page of memory that is not mapped by a memory management unit (e.g., the memory management component 414), in embodiments of the present disclosure, the page fault described above can be generated by the hierarchical memory apparatus 404 in response to the data being mapped in the memory management component 414 to the hierarchical memory apparatus 404, which, in turn maps the data to the persistent memory device 316.

In some embodiments, the intermediate memory component 420 can be used to buffer data that is stored in the persistent memory device 416 in response to a data request initiated by the I/O device 410. In contrast to the persistent memory device 416, which may pass data via a PCIe interface, the intermediate memory component 420 may employ a DDR interface to pass data. Accordingly, in some embodiments, the intermediate memory component 420 may operate in a deterministic fashion. For example, in some embodiments, data requested that is stored in the persistent memory device 416 can be temporarily transferred from the persistent memory device 416 to the intermediate memory component 420 and subsequently transferred to a host computing device via a DDR interface coupling the intermediate memory component 420 to the I/O device 410.

In some embodiments, the intermediate memory component can comprise a discrete memory component (e.g., an SRAM cache) deployed in the computing system 401. However, embodiments are not so limited and, in some embodiments, the intermediate memory component 420 can be a portion of the non-persistent memory device 430 that can be allocated for use in transferring data from the persistent memory device 416 in response to a data request.

In a non-limiting example, memory management circuitry (e.g., the memory management component 414) can be coupled to the hierarchical memory component 404 (e.g. logic circuitry). The memory management circuitry can be configured to receive a request to write data having a corresponding virtual network interface controller address associated therewith to a non-persistent memory device (e.g., the non-persistent memory device 430). The memory management circuitry can be further configured to redirect the request to write the data to the logic circuitry, based, at least in part, on characteristics of the data. The characteristics of the data can include how frequently the data is requested or accessed, an amount of time that has transpired since the data was last accessed or requested, a type of data (e.g., whether the data corresponds to a particular file type such as a photograph, a document, an audio file, an application file, etc.), among others.

In some embodiments, the memory management circuitry can be configured to redirect the request to the logic circuitry based on commands generated by and/or instructions executed by the hypervisor 412. For example, as described above, the hypervisor 412 can execute instructions to control whether data corresponding to a data request (e.g., a data request generated by the I/O device 410) is to be stored in the persistent memory device 416 or the non-persistent memory device 430.

In some embodiments, the hypervisor 412 can facilitate redirection of the request by writing addresses (e.g., logical addresses) to the memory management circuitry. For example, if the hypervisor 412 determines that data corresponding to a particular data request is to be stored in (or retrieved from) the persistent memory device 416, the hypervisor 412 can cause an address corresponding to redirection of the request to be stored by the memory management circuitry such that the data request is redirected to the logic circuitry.

Upon receipt of the redirected request, the logic circuitry can be configured to determine (e.g., generate) an address corresponding to the data in response to receipt of the redirected request and/or store the address in an address register 406 within the logic circuitry, as previously described herein. In some embodiments, the logic circuitry can be configured to associate an indication with the data that indicates that the data is inaccessible to the non-persistent memory device 430 based on receipt of the redirected request, as previously described herein.

The logic circuitry can be configured to cause the data to be written to a persistent memory device (e.g., the persistent memory device 416) based, at least in part, on receipt of the redirected request. In some embodiments, the logic circuitry can be configured to generate an interrupt signal and assert the interrupt signal to a hypervisor (e.g., the hypervisor 412) coupled to the logic circuitry as part of causing the data to be written to the persistent memory device 416, as previously described herein. As described above, the persistent memory device 416 can comprise a 3D XP memory device, an array of self-selecting memory cells, a NAND memory device, or other suitable persistent memory, or combinations thereof.

In some embodiments, the logic circuitry can be configured to receive a redirected request from the memory management circuitry to retrieve the data from the persistent memory device 416, transfer a request to retrieve the data from the persistent memory device 416 to hypervisor 412, and/or assert an interrupt signal to the hypervisor 412 as part of the request to retrieve the data from the persistent memory device 416, as previously described herein. The hypervisor 412 can be configured to retrieve the data from the persistent memory device 416 and/or transfer the data to the non-persistent memory device 430. Once the data has been retrieved from the persistent memory device 416, the hypervisor 412 can be configured to cause an updated address associated with the data to be transferred to the memory management circuitry 414.

In another non-limiting example, the computing system 401 can be a multi-user network such as a software-defined data center, a cloud computing environment, etc. The multi-user network can include a pool of computing resources that include a non-persistent memory device 430 and a persistent memory device 416. The multi-user network can further include an interface 408 coupled to hierarchical memory component 404 (e.g., logic circuitry) comprising a plurality of address registers 406. In some embodiments, the multi-user network can further include a hypervisor 412 coupled to the interface 408.

The hypervisor 412 can be configured to receive a request to access data corresponding to the non-persistent memory component 430, determine that the data is stored in the persistent memory device, and cause the request to access the data to be redirected to the logic circuitry. The request to access the data can be a request to read the data from the persistent memory device or the non-persistent memory device or a request to write the data to the persistent memory device or the non-persistent memory device.

In some embodiments, the logic circuitry can be configured to transfer a request to the hypervisor 412 to access the data from the persistent memory device 416 in response to the determination that the data is stored in the persistent memory device 416. The logic circuitry can be configured to assert an interrupt to the hypervisor as part of the request to the hypervisor 412 to access the data corresponding to the persistent memory device 416, as previously described herein.

The hypervisor 412 can be configured to cause the data to be accessed using the persistent memory device 416 based on the request received from the logic circuitry. As described above, the persistent memory device 416 can comprise a resistance variable memory device such as a resistive memory, a phase change memory, an array of self-selecting memory cells, or combinations thereof. In some embodiments, the hypervisor 412 can be configured to cause the data to be transferred to a non-persistent memory device 430 as part of causing the data to be accessed using the persistent memory device 416.

The hypervisor 412 can be further configured to update information stored in a memory management component 414 associated with the multi-user network in response to causing the data to be accessed using the persistent memory device 416. For example, the hypervisor 412 can be configured to cause updated virtual addresses corresponding to the data to be stored in the memory management component 414.

The multi-user network can, in some embodiments, include an I/O device 410 coupled to the logic circuitry. In such embodiments, the logic circuitry can be configured to send a notification to the I/O device 410 in response to the hypervisor 412 causing the data to be accessed using the persistent memory device 416.

Figure 5:
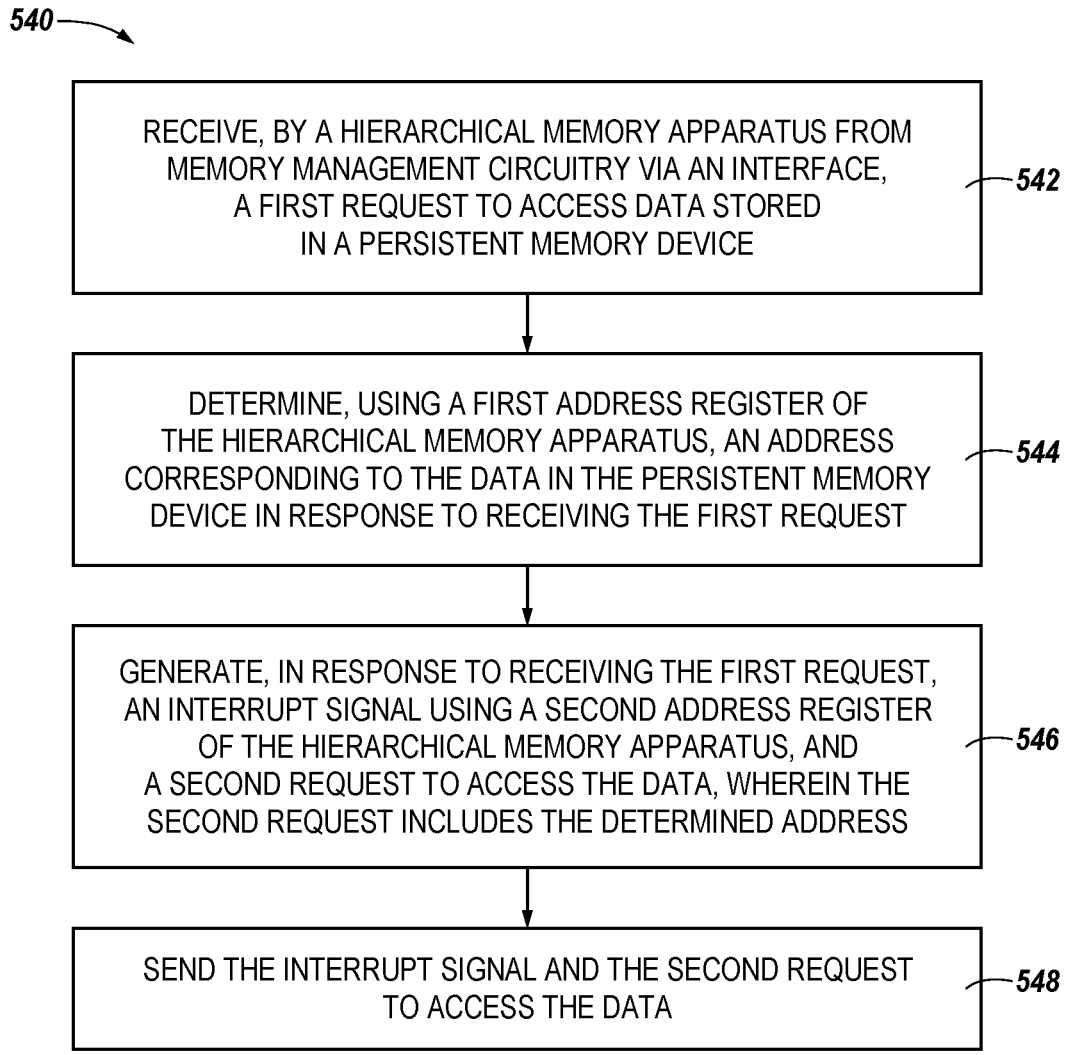
FIG. 5 is a flow diagram representing an example method for a hierarchical memory apparatus in accordance with a number of embodiments of the present disclosure.

FIG. 5 is a flow diagram representing an example method 540 for a hierarchical memory apparatus in accordance with a number of embodiments of the present disclosure. The hierarchical memory apparatus can be, for example, hierarchical memory apparatus 104/204/304/404 previously described in connection with FIGS. 1, 2, 3, and 4.

At block 542, the method 540 can include receiving, by the hierarchical memory apparatus from memory management circuitry via an interface, a first request to access data stored in a persistent memory device. The memory management circuitry, the interface, and the persistent memory device can be, for example, memory management circuitry (e.g., component) 314/414, interface 308/408, and persistent memory device 316/416, respectively, previously described in connection with FIGS. 3 and 4. The first request can be, for example, a redirected request from an I/O device, as previously described herein.

At block 544, the method 540 can include determining, using a first address register of the hierarchical memory apparatus, an address corresponding to the data in the persistent memory device in response to receiving the first request. The first address register can be, for example, address register 106-N/206-N previously described in connection with FIGS. 1 and 2, and can be used to determine the address corresponding to the data in a manner analogous to that described in connection with FIGS. 1 and 2.

At block 546, the method 540 can include generating, in response to receiving the first request, an interrupt signal using a second address register of the hierarchical memory apparatus, and a second request to access the data, wherein the second request includes the address determined at block 544. The second address register can be, for example, address register 106-2/206-2 previously described in connection with FIGS. 1 and 2, and can be used to generate the interrupt signal in a manner analogous to that previously described in connection with FIGS. 1 and 2.

At block 548, the method 540 can include sending the interrupt signal and the second request to access the data. The interrupt signal and the second request can be sent in a manner analogous to that previously described in connection with FIGS. 1 and 2.

Figure 6:
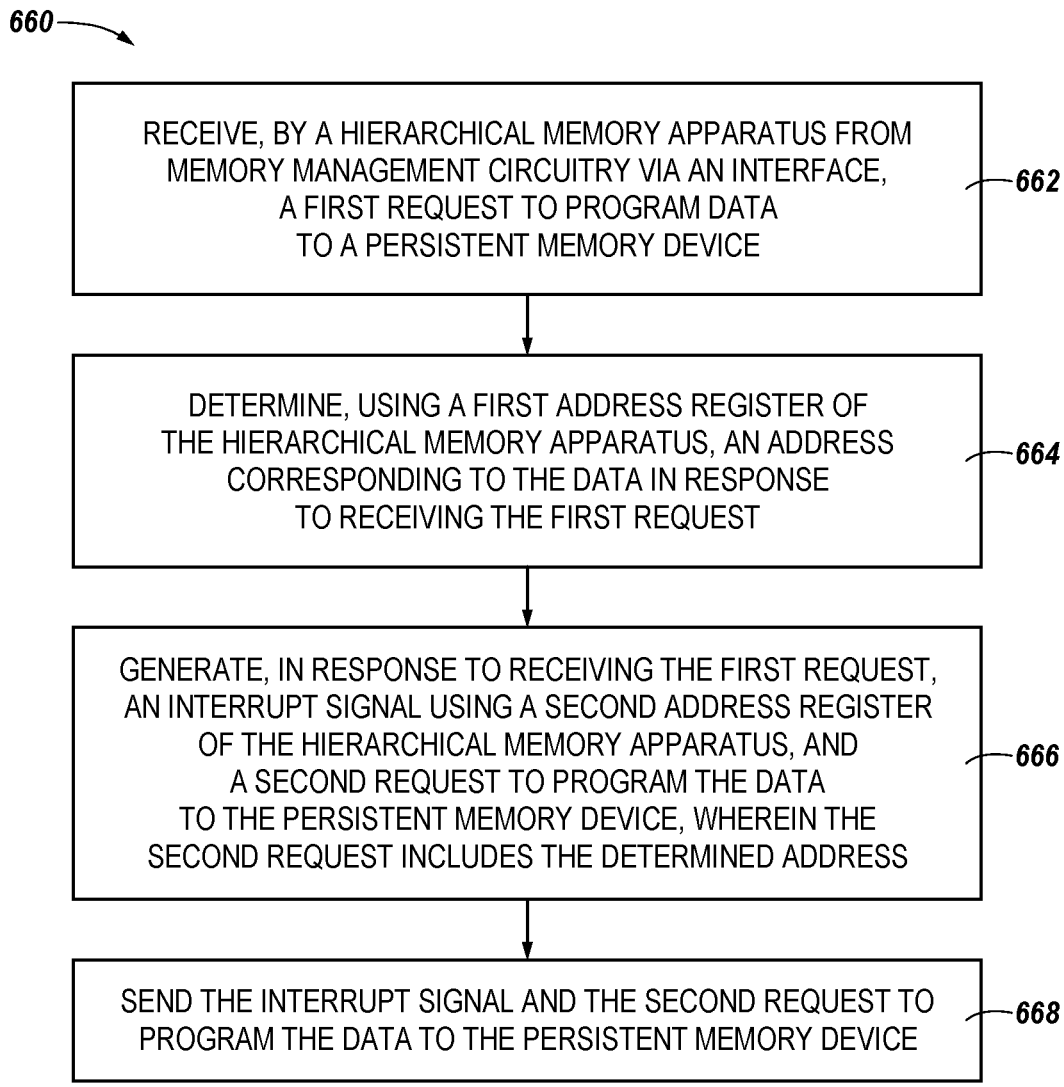
FIG. 6 is another flow diagram representing an example method for a hierarchical memory apparatus in accordance with a number of embodiments of the present disclosure.

FIG. 6 is another flow diagram representing an example method 660 for a hierarchical memory apparatus in accordance with a number of embodiments of the present disclosure. The hierarchical memory apparatus can be, for example, hierarchical memory apparatus 104/204/304/404 previously described in connection with FIGS. 1, 2, 3, and 4.

At block 662, the method 660 can include receiving, by the hierarchical memory apparatus from memory management circuitry via an interface, a first request to program data to a persistent memory device. The memory management circuitry, the interface, and the persistent memory device can be, for example, memory management circuitry (e.g., component) 314/414, interface 308/408, and persistent memory device 316/416, respectively, previously described in connection with FIGS. 3 and 4. The first request can be, for example, a redirected request from an I/O device, as previously described herein.

At block 664, the method 660 can include determining, using a first address register of the hierarchical memory apparatus, an address corresponding to the data in response to receiving the first request. The first address register can be, for example, address register 106-N/206-N previously described in connection with FIGS. 1 and 2, and can be used to determine the address corresponding to the data in a manner analogous to that described in connection with FIGS. 1 and 2.

At block 666, the method 660 can include generating, in response to receiving the first request, an interrupt signal using a second address register of the hierarchical memory apparatus, and a second request to program the data to the persistent memory device, wherein the second request includes the address determined at block 664. The second address register can be, for example, address register 106-2/206-2 previously described in connection with FIGS. 1 and 2, and can be used to generate the interrupt signal in a manner analogous to that previously described in connection with FIGS. 1 and 2.

At block 668, the method 660 can include sending the interrupt signal and the second request to program the data to the persistent memory device. The interrupt signal and the second request can be sent in a manner analogous to that previously described in connection with FIGS. 1 and 2.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   one or more processing devices in communication with a multiplexer and with a memory controller; and
   logic circuitry coupled to the processing device, wherein the logic circuitry is configured to:
     transfer to and receive from the multiplexer:
       access data; and
       control messages; and
     transfer interrupt request messages to a base address register of the memory controller that diverts data from a volatile memory device to a non-volatile memory device associated with the memory controller; and
     send a command indicating an access to an additional base register of the memory controller.

2. The apparatus of claim 1, further comprising the non-volatile memory device and the volatile memory device each coupled to the one or more processing devices, wherein the non-volatile memory device is a persistent memory device and the volatile memory device is a non-persistent memory device.

3. The apparatus of claim 1, wherein the sent command is associated with a data access of the non-volatile memory device, the volatile memory device, or both, that has occurred.

4. The apparatus of claim 1, wherein at least one of the one or more processing devices is a finite state machine or a hardware state machine.

5. The apparatus of claim 1, wherein the logic circuitry being configured to transfer the access data comprises the logic circuitry being configured to receive a first request to access a portion of data stored in the non-volatile memory device.

6. The apparatus of claim 1, wherein the logic circuitry is configured to transfer the interrupt request messages based on whether the access data indicates to:
   retrieve data from the non-volatile memory device; or
   write data to the non-volatile memory device.

7. A system, comprising:
   a state machine in communication with a memory controller and comprising logic circuitry; and
   a multiplexer coupled to the state machine and in communication with the memory controller;
   wherein the logic circuitry is configured to:
     send control messages to the multiplexer; and
     receive access data from the multiplexer;
   wherein the multiplexer is configured to:
     generate an interrupt message that is sent to a base address register of the memory controller indicating access to a different base address register; and
     cause data to be transferred to a persistent memory device based on the interrupt message;

wherein the access data indicates that access to the different base register of the memory controller has occurred.

8. The system of claim 7, further comprising the persistent memory device and a non-persistent memory device each coupled to the state machine.

9. The system of claim 7, wherein the logic circuitry is configured to cause the data to be transferred to the persistent memory device instead of a non-persistent memory device.

10. The system of claim 9, wherein the logic circuitry is further configured to receive:
logical addressing data corresponding to data to be written to the persistent memory device; or
addressing data that corresponds to data to be retrieved from the persistent memory device, or both.

11. The system of claim 9, wherein the logic circuitry is configured to:
receive a redirected request to access data stored in the persistent memory device.

12. The system of claim 11, wherein the logic circuitry is further configured to:
generate an interrupt signal and an additional request to access the data that includes the determined address; and
send the interrupt signal and the additional request to access the data.

13. The system of claim 11, wherein the logic circuitry is configured to:
determine an address corresponding to the data in the persistent memory device in response to receiving a request to program data to the persistent memory device.

14. A system, comprising:
a state machine in communication with a memory controller, wherein the state machine comprises:
one or more processing devices; and
logic circuitry;
a multiplexer coupled to the state machine and to a memory resource and in communication with the memory controller;
wherein the logic circuitry is configured to:
receive a first request to program data to a persistent memory device associated with the memory resource;
associate information with the data that indicates the data is inaccessible by a non-persistent memory device in response to receiving the first request to program the data to the persistent memory device; and
in response to associating the information, generate an interrupt signal that is sent to a base address register of the memory controller and that diverts the data from the non-persistent memory device to the persistent memory device;
wherein the data of the first request is associated with an access of an additional base address register of the memory controller different than the base address register.

15. The system of claim 14, wherein the access of the additional base address register is associated with a data access of the non-persistent memory device.

16. The system of claim 14, wherein the logic circuitry is further configured to:
in response to receiving the first request:
determine an address associated with the base address register corresponding to the data based on an additional base address register initially associated with the first request of the memory controller.

17. The system of claim 16, wherein the logic circuitry is further configured to send the second request to program the data directly to the persistent memory device.

18. The system of claim 16, wherein the logic circuitry is further configured to:
in response to receiving the first request:
generate a second request to program the data to the persistent memory device, wherein the second request includes the determined address.

19. The system of claim 14, wherein the first request is a redirected request from an input/output (I/O) device.

* * * * *